(12) United States Patent
Shintate et al.

(10) Patent No.: US 8,888,229 B2
(45) Date of Patent: *Nov. 18, 2014

(54) METHOD FOR FORMING A LAYER, METHOD FOR MANUFACTURING AN ACTIVE MATRIX SUBSTRATE, AND METHOD FOR MANUFACTURING A MULTILAYERED WIRING SUBSTRATE

(75) Inventors: Tsuyoshi Shintate, Fujimi (JP); Koichi Mizugaki, Suwa (JP); Kazuaki Sakurada, Suwa (JP); Kenji Wada, Fujimi (JP)

(73) Assignee: Seiko Epson Corporation (JP)

( * ) Notice: Subject to any disclaimer, the term of this patent is extended or adjusted under 35 U.S.C. 154(b) by 2189 days.

This patent is subject to a terminal disclaimer.

(21) Appl. No.: 11/467,295

(22) Filed: Aug. 25, 2006

(65) Prior Publication Data

US 2007/0046718 A1    Mar. 1, 2007

(30) Foreign Application Priority Data

Aug. 26, 2005 (JP) ................................ 2005-245359
Jul. 31, 2006 (JP) ................................ 2006-207550

(51) Int. Cl.

| | |
|---|---|
| *B05D 7/00* | (2006.01) |
| *H01L 21/768* | (2006.01) |
| *H05K 3/12* | (2006.01) |
| *H01L 27/12* | (2006.01) |
| *H01L 21/288* | (2006.01) |
| *G02F 1/1362* | (2006.01) |
| *G02F 1/1337* | (2006.01) |

(52) U.S. Cl.
CPC .... *H05K 3/125* (2013.01); *G02F 2001/136295* (2013.01); *H05K 2203/013* (2013.01); *H01L 21/76838* (2013.01); *H01L 27/1214* (2013.01); *H05K 2203/1476* (2013.01); *H01L 21/288* (2013.01); *G02F 1/133711* (2013.01); *H05K 2203/095* (2013.01); *H05K 2203/1173* (2013.01)
USPC ............................................... 347/21; 427/64

(58) Field of Classification Search
USPC .......... 347/1, 12–15, 20, 40, 47, 58, 101, 102
See application file for complete search history.

(56) References Cited

U.S. PATENT DOCUMENTS

| | | | | |
|---|---|---|---|---|
| 6,053,596 | A  * | 4/2000 | Nakano et al. ................... | 347/15 |
| 6,328,400 | B1 * | 12/2001 | Yonekubo et al. ............... | 347/15 |
| 2003/0083203 | A1 | 5/2003 | Hashimoto et al. | |
| 2003/0085057 | A1* | 5/2003 | Hashimoto ................... | 174/261 |
| 2003/0099774 | A1 | 5/2003 | Morii et al. | |
| 2004/0131782 | A1 | 7/2004 | Hasei et al. | |
| 2005/0031836 | A1 | 2/2005 | Hirai | |

FOREIGN PATENT DOCUMENTS

| | | | |
|---|---|---|---|
| JP | 2003-121635 A | 4/2003 | |
| JP | 2003-260406 A | 9/2003 | |
| JP | 2003-260408 A | 9/2003 | |
| JP | 2004-119479 | 4/2004 | |
| JP | 2005-034837 | 2/2005 | |

* cited by examiner

*Primary Examiner* — Robert Vetere

(74) *Attorney, Agent, or Firm* — Harness, Dickey & Pierce, P.L.C.

(57) ABSTRACT

A method for forming a layer comprises (a) disposing a first droplet to two parts on an underlayer surface so as to form two dot patterns isolated each other on the underlayer surface, (b) fixing the two dot patterns to the underlayer surface, (c) giving lyophilicity with respect to a second droplet to at least the underlayer surface between the two dot patterns, and (d) disposing the second droplet to the underlayer surface between the two dot patterns so as to join the two dot patterns after the step (c).

4 Claims, 19 Drawing Sheets

METHOD FOR FORMING A LAYER, METHOD FOR MANUFACTURING AN ACTIVE MATRIX SUBSTRATE, AND METHOD FOR MANUFACTURING A MULTILAYERED WIRING SUBSTRATE

BACKGROUND

1. Technical Field

The present invention relates to a method for forming a layer, a method for manufacturing an active matrix substrate, and a method for manufacturing a multilayered wiring substrate that include a process to dispose a droplet.

2. Related Art

A method for manufacturing a line pattern by using a droplet discharge device is known as disclosed in JP-A-2005-34837.

An inkjet process includes a process to dispose a liquid material called a functional liquid to an objective surface by using a droplet discharge device. The droplet discharge device is typically provided with a head and a mechanism. The head discharges a functional liquid as a droplet. The mechanism relatively moves the head two dimensionally with respect to an underlayer surface, which is an object of discharging the droplet. With such structure, the droplet of the functional liquid can be disposed to any position on the underlayer surface.

When an underlayer surface, which has an area larger than an area on which one droplet wets and spreads, is fully covered with a functional liquid by utilizing such inkjet process, a plurality of droplets are disposed so that areas in which droplets wet and spread are overlapped each other on the underlayer surface. As a result, a pattern fully covering the underlayer surface can be achieved. However, if the underlayer has lyophobicity with respect to the functional liquid, the functional liquid may be gathered locally since attracting force due to surface tension between droplets contacted each other is stronger than attracting force between droplets and the underlayer surface. The concentration results in the underlayer surface being unevenly covered with the functional liquid. In the worst case, a part of the underlayer surface is exposed due to a shortage of the functional liquid.

SUMMARY

An advantage of the invention is to provide a method for forming a favorable pattern without spaces by disposing a droplet to an underlayer surface.

A method for forming a layer according to a first aspect of the invention includes: (a) disposing a first droplet to two parts on an underlayer surface so as to form two dot patterns isolated each other on the underlayer surface; (b) fixing the two dot patterns to the underlayer surface; (c) giving lyophilicity with respect to a second droplet to at least the underlayer surface between the two dot patterns; and (d) disposing the second droplet to the underlayer surface between the two dot patterns so as to join the two dot patterns after the step (c). Here, the step (c) may further include disposing a third droplet on each of the two dot patterns after the step (b). The step (c) may also further include applying an ultraviolet ray to the underlayer surface or exposing the underlayer surface to plasma.

According to the step (b), the two dot patterns are fixed to the underlayer surface. Thus, two dot patterns are hardly moved on the underlayer surface due to the step (b).

According to the step (c), lyophicity with respect to the second droplet is given to the underlayer surface between the two dot patterns before disposing the second droplet so as to join the two dot patterns. The step (c) allows the second droplet to hardly move with respect to the underlayer surface.

Accordingly, the steps (b) and (c) make the dot patterns and the second droplet hardly move with respect to the underlayer surface, even though the two dot patterns and the second droplet are joined each other on the underlayer surface in the step (d). This results in a local aggregation of a functional liquid being hardly formed. As a result, a possibility to form a hole in the resulting layer on the underlayer surface is reduced.

The method may further include activating or drying the two dot patterns after the step (d).

This reduces a possibility to form a hole in the resulting layer achieved from the dot patterns formed by disposing a droplet.

In the method, at least one of a volume of the second droplet and a volume of the third droplet may differ from a volume of the first droplet.

A method for forming a layer according to a second aspect of the invention includes: (a) disposing a first droplet to each of a plurality of parts on an underlayer surface so as to form a plurality of dot patterns arranged in an array defined by a first direction and a second direction on the underlayer surface; (b) fixing the plurality of dot patterns to the underlayer surface; (c) disposing a second droplet to an area between the dot patterns arranged in the first direction so as to join the dot patterns in the first direction after the step (b); (d) disposing a third droplet to an area between the dot patterns arranged in the second direction so as to join the dot patterns in the second direction after the step (c); and (e) disposing a fourth droplet to an area between dot patterns arranged in a combined direction of the first direction and the second direction after the step (d).

Accordingly, each of the plurality of dot patterns achieved by disposing the first droplet is fixed to respective parts on the underlayer surface. As a result, the first droplet does not move when the second and third droplets overlap the first droplet even though the underlayer surface has lyophobicity with respect to the first droplet.

The method preferably further includes (f) giving lyophilicity to the underlayer surface between the steps (b) and (c). Here, the step (f) may further include disposing a fifth droplet on each of the plurality of dot patterns. The step (f) may also further include applying an ultraviolet ray to the underlayer surface or exposing the underlayer surface to plasma.

This gives an effect that the second droplet is not drawn toward the dot patterns side even though the second droplet overlaps the dot patterns already formed.

The method may further include activating or drying the plurality of dot patterns after the step (e).

This reduces a possibility to form a hole in the resulting layer achieved from the dot patterns formed by disposing a droplet.

In the method, at least one of a volume of the second droplet, a volume of the third droplet, a volume of the fourth droplet and a volume of the fifth droplet may differ from a volume of the first droplet.

A method for manufacturing an active matrix substrate according to a third aspect of the invention includes: (a) disposing a first droplet to two parts on an underlayer surface so as to form two dot patterns isolated each other on the underlayer surface; (b) fixing the two dot patterns to the underlayer surface; (c) giving lyophilicity with respect to a second droplet to at least the underlayer surface between the two dot patterns; and (d) disposing the second droplet to the underlayer surface between the two dot patterns so as to join the two dot patterns after the step (c).

A method for manufacturing a multilayered wiring substrate according to a fourth aspect of the invention includes: (a) disposing a first droplet to two parts on an underlayer surface so as to form two dot patterns isolated each other on the underlayer surface; (b) fixing the two dot patterns to the underlayer surface; (c) giving lyophilicity with respect to a second droplet to at least the underlayer surface between the two dot patterns; and (d) disposing the second droplet to the underlayer surface between the two dot patterns so as to join the two dot patterns after the step (c).

BRIEF DESCRIPTION OF THE DRAWINGS

The invention will be described with reference to the accompanying drawings, wherein like numbers reference like elements.

DESCRIPTION OF EXEMPLARY EMBODIMENTS

In a method for forming a layer according to a first embodiment of the invention, which will be described below, a droplet is disposed to the surface of a substrate 10A (FIG. 1) serving as an underlayer, finally resulting in a solid conductive layer 8 (FIG. 10) being formed. In the method, a process to dispose a droplet is preferably carried out by a droplet discharge device. Here, an inkjet device is an example of the droplet discharge device.

The droplet discharge device, specifically, is provided with a head, a stage, and a mechanism. The head discharges a droplet. Placed on the stage is the substrate 10A to which the droplet is disposed. The mechanism moves at least one of the head and stage relative to the other, thereby the head is faced at any position on the substrate 10A. Here, the volume of a droplet discharged from the head is variable from 1.5 to 42 pl. In the droplet discharge device having such scheme, the head discharges a droplet toward a predetermined position on the substrate 10A to dispose the droplet at the predetermined position.

In some cases, a droplet discharge device may not be necessarily used. Specifically, as long as a functional liquid is disposed to an underlayer surface as a droplet form, the method for forming a layer can be carried out. For example, a droplet may be disposed by a micropipette instead of a droplet discharge device. The volume of a droplet may be 1.5 pl or less, or 42 pl or more.

The method for forming a layer according to the first embodiment of the invention will now be described in detail below.

1. Block

Figure 1:
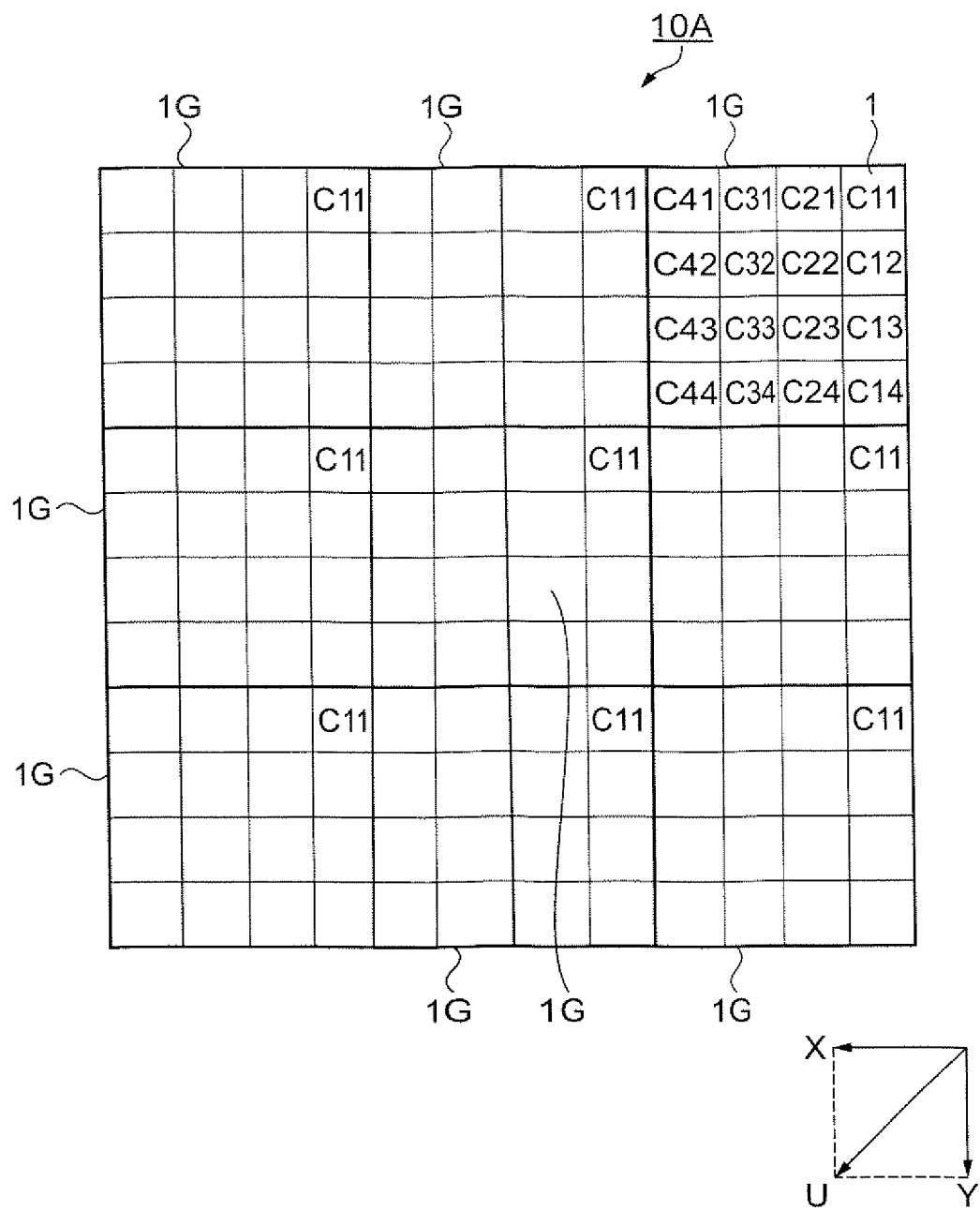
FIG. 1 is a schematic view illustrating blocks corresponding to a surface of a substrate.

As shown in FIG. 1, a plurality of blocks 1, which are hypothetical blocks, correspond to at least an area, in which a conductive layer is formed, of the surface of the substrate 10A. The plurality of blocks 1 is arranged in an array defined by the X-axis and Y-axis directions. Each of the plurality of blocks 1 has a length of 11 μm along the X-axis direction, while a length of 15 μm along the Y-axis direction. Here, the X-axis direction and the Y-axis direction are orthogonal each other. The substrate 10A is made of polyimide and has a tape-like shape. In the first embodiment, the surface of the substrate 10A is an example of an underlayer surface of the invention. On the underlayer surface, an area in which a conductive layer is formed is also described as a "layer forming area."

Each of the plurality of blocks 1 is an area to which a droplet is disposed, namely, is a part. In the first embodiment, when a droplet is disposed to a block 1 out of the plurality of blocks 1, the droplet is disposed so that the center of the droplet nearly coincides with the center of the block 1. In addition, the pitch of the plurality of blocks 1 in the X-axis direction corresponds to the minimum center distance between two droplets adjacent each other in the X-axis direction. Likewise, the pitch of the plurality of blocks 1 in the Y-axis direction corresponds to the minimum center distance between two droplets adjacent each other in the Y-axis direction. While FIG. 1 shows 144 (12×12) pieces of the block 1 for convenience of description, the actual number of blocks 1 is not limited to this number.

Here, a block group 1G is defined as a group of 16 pieces of blocks 1, i.e., 4 blocks×4 blocks. Each of 16 pieces of the blocks 1 is denoted by a numeral in order to identify each block 1 in one block group 1G. The numeral is made up of the letter "C" and a suffix of two digits, e.g. C11. Here, the numeric at the right of the suffix shows a position in a block group 1G along the Y-axis direction, and is an integer from 1 to 4. In contrast, the numeric at the left of the suffix shows a position in a block group 1G along the X-axis direction, and is an integer from 1 to 4.

As for a plurality of C11s, it is arranged in an array defined by the X-axis and Y-axis directions on the surface of the substrate 10A. Specifically, the plurality of C11s is periodically located in the X-axis direction, the Y-axis direction, and a combined direction U, which is the combined direction of the X-axis and Y-axis directions. In the first embodiment, the center distance of arbitrary two of C11s adjacent each other in the X-axis direction is 44.0 μm. The center distance of arbitrary two of C11s adjacent each other in the Y-axis direction is 60.0 μm. The center distance of arbitrary two of C11s adjacent each other in the combined direction U is 74.4 μm. The combined direction U is the direction of the diagonal line of the block 1.

2. Functional Liquid

The process to provide the conductive layer 8 includes a process to dispose a droplet of a functional liquid. Here, "functional liquid" means a liquid material that has enough viscosity to be discharged from a nozzle included in a head of a droplet discharge device as a droplet. The functional liquid can be either water- or oil-based material. It is enough to have fluidity (viscosity) with which the functional liquid can be discharged from the nozzle, and no matter if it contains a solid matter as long as it remains as fluid as a whole. The viscosity of the functional liquid is preferably within the range from 1 mPa·s to 50 mPa·s. If the viscosity is 1 mPa·s or more, the periphery of the nozzle is hardly contaminated with the functional liquid when discharging the functional liquid. In contrast, if the viscosity is 50 mPa·s or less, the possibility of the clogging of the nozzle is reduced, thereby a smooth droplet discharge can be achieved.

The functional liquid in the first embodiment includes a dispersion medium and silver as a conductive material. Here, silver contained in the functional liquid has a particle form of an average diameter of approximately 10 nm. In addition, the silver particles are covered with a coating material. The silver particles covered with the coating material are stably dispersed into the dispersion medium. Further, particles having an average diameter of from one nanometer to some hundred nanometers are also expressed as "nanoparticles." According to the expression, the functional liquid includes silver nanoparticles.

Here, any dispersion medium (or solvent) can be used as long as it is capable of dispersing conductive particles such as silver particles and does not cause an aggregation. Examples of the medium can include: water; alcohols such as methanol, ethanol, propanol, and butanol; hydrocarbon compounds such as n-heptane, n-octane, decane, dodecane, tetradecane, toluene, xylene, cymene, durene, indene, dipentene, tetrahydronaphthalene, decahydronaphthalene, and cyclohexylbenzene; ether compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl)ether, and p-dioxane; and polar compounds such as propylene carbonate, gamma-butyrolactone, N-methyl-2-pyrrolidone, dimethylformamide, dimethyl sulfoxide, and cyclohexanone. Among them, water, alcohols, hydrocarbon compounds, and ether compounds are preferably used in terms of the dispersibility of conductive particles, dispersion-liquid stability, and applicability to an inkjet process. Water and hydrocarbon compounds can be exemplified as a more preferable dispersion medium.

Here, the coating material is a compound that is capable of being coordinated with silver atoms. Examples of the coating material include amine, alcohol, and thiol. More specifically, as the coating material, an amine compound such as 2-methylaminoethanol, diethanolamine, diethylmethylamine, 2-dimethylaminoethanol, or methyldiethanolamine, alkylamines, ethylendiamine, alkylalchols, ethyleneglycol, propyleneglycol, alkylethiols, or ethanedithiol can be exemplified. The silver nanoparticles covered with the coating material can be more stably dispersed into a dispersion medium.

3. Order of Disposing a Droplet

Figure 2:
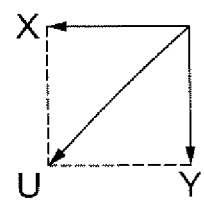
FIG. 2 is a diagram illustrating an order to dispose a droplet to the blocks.

A solid pattern, which continues in the X-axis and Y-axis directions and the combined direction U without spaces, will be formed in a layer forming area that corresponds to 9 blocks×9 blocks based on the block 1 at the upper right in FIG. 2 as a reference position. Here, "solid pattern" means a layer that turns to the conductive layer 8 through an activation process described later. The area of the layer forming area that corresponds to 9 blocks×9 blocks is slightly larger than the area of 9 blocks×9 blocks, since a disposed droplet wets and spreads on the surface slightly over the area of 9 blocks×9 blocks.

Another embodiment, of course, may include a layer forming area that corresponds to an area other than 9 blocks×9 blocks. For example, a layer forming area may correspond to 100 blocks×100 blocks, or 1 block×5 blocks. In addition, a layer forming area may be set so that a row or a column including C11 corresponds to the outermost of the layer forming area and/or C11 corresponds to a corner of the layer forming area. Here, "row" means a group of the block 1 arranged in one line in the X-axis direction, while "column" means a group of the block 1 arranged in one line in the Y-axis direction.

With reference to FIG. 2, a process to dispose a droplet to the layer forming area will be described. As shown in FIG. 2, the order of disposing a droplet is the same in each of the plurality of block groups 1G (FIG. 1). Specifically, in each block group 1G, the order of disposing a droplet is C11, C31, C13, and C33.

However, in the block groups G1 located at the upper left, and the center left in FIG. 2, C11 and C13 correspond to the layer forming area, but C31 and C33 do not correspond to the layer forming area. Therefore, in the two block groups 1G, C31 and C33 are skipped when disposing a droplet. Likewise, in the block group 1G located at the lower left in FIG. 2, C11 corresponds to the layer forming area, but C31, C13, and C33 do not correspond to the layer forming area. Therefore, in the block groups 1G, C31, C13 and C33 are skipped when disposing a droplet. In addition, in the block groups 1G located at the center lower and the lower right in FIG. 2, C11 and C31 correspond to the layer forming area, but C13 and C33 do not correspond to the layer forming area. Therefore, in the two block groups 1G, C13 and C33 are skipped when disposing a droplet.

3A. Process to Dispose a Basic Dot

First, the landed diameter of a droplet is set to be 30 μm. The landed diameter also means the diameter of an area in which a droplet disposed to the substrate 10A wets and spreads on the substrate 10A. Here, the shape of a droplet immediately after discharged from a nozzle of a droplet discharge device shows nearly axial symmetry in relation to a discharge direction. Thus, the shape of an area of a droplet landed on the substrate 10A shows nearly a circular form. In this specification, the droplet landed on the substrate 10A or the area of the landed droplet is also described as a "dot."

Figure 3:
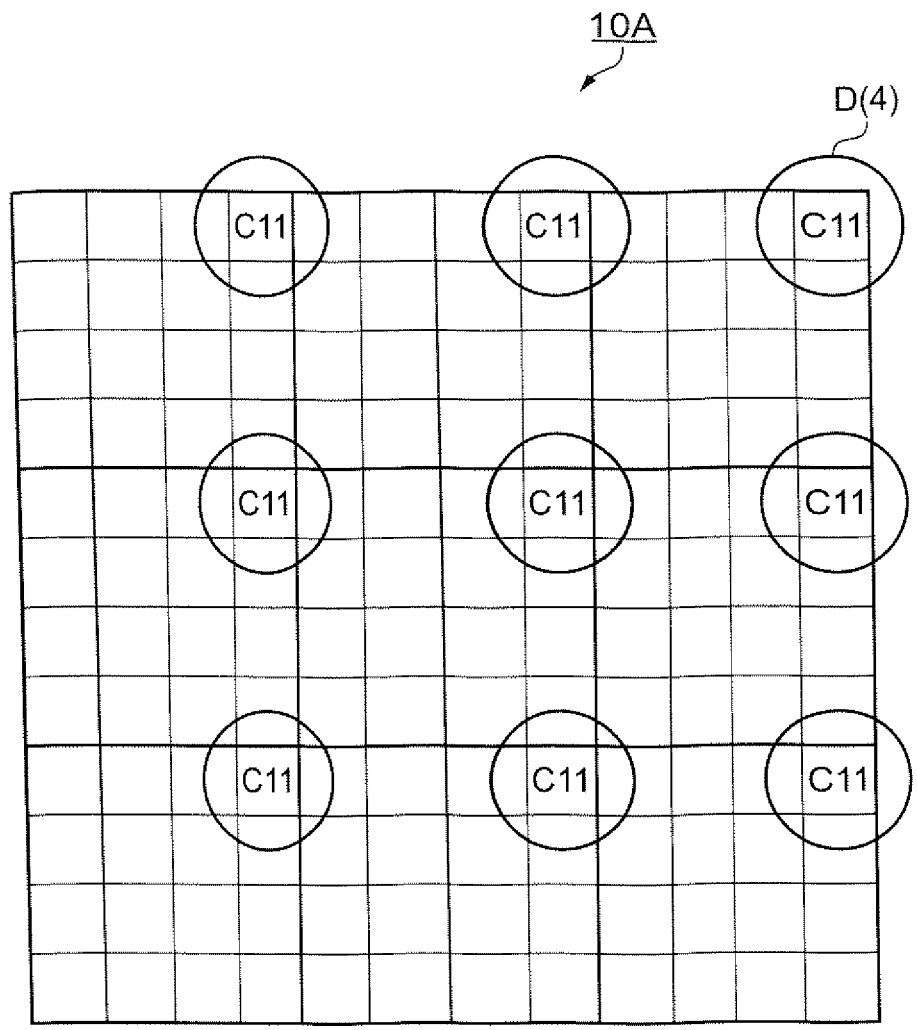
FIG. 3 is a diagram illustrating a process to dispose a droplet to C11s.

Then, as shown in FIG. 3, a droplet D is disposed to each of the plurality of C11s in the layer forming area. Namely, the droplet D is disposed to one out of 4 blocks 1 that correspond to respective 4 corners, in each of the plurality of block groups 1G. In this case, the droplet D is disposed so that the center of the droplet D coincides with the center of C11. In this regard, the droplet D that is fully disposed as a beginning disposition in an area that corresponds to each block group 1G is also described as a "basic dot."

Upon disposing the droplet to C11, the droplet D spreads in a range of 15 μm from the center of C11, since the landed diameter of the droplet D is 30 μm as described above. As a result, a dot pattern 4 is achieved. Here, the center distance of two of C11s adjacent each other in the X-axis direction is 44 μm, while the center distance of two of C11s adjacent each other in the Y-axis direction is 60 μm. The center distance of two of C11s adjacent each other in the combined direction U is 74.4 μm. Therefore, the dot pattern 4 on any C11 does not touch the dot pattern 4 on adjacent C11. Namely, the dot pattern 4 on any C11 is isolated from the dot pattern 4 on its adjacent C11.

As the result of the process described above, a plurality of dot patterns 4 is arranged in an array defined by the X-axis and Y-axis directions so as to be isolated each other. The plurality of dot patterns 4 corresponds to the plurality of C11s. Thus, the number of C11s is equal to that of dot patterns 4. Here, C11 is also described as a "reference area."

3B. Process to Fix a Basic Dot

Next, each droplet D disposed to each C11 is fixed. Namely, each of dot patterns 4 is fixed to respective C11s. Specifically, the dot pattern 4 is dried to a degree in which a solvent (or dispersion medium) is volatilized from a functional liquid forming the dot pattern 4. In the first embodiment, a dryer blows hot air to the dot pattern 4 on each C11. Generally, a functional liquid moves easily on a surface having lyophobicity. In the first embodiment, however, the dot pattern 4 loses fluidity since it is dried as described. Accordingly, the dot pattern 4 is fixed to C11. As a result, this reduces a possibility that the dot pattern 4 on C11 is drawn to C31, C13, or C33 even though the dot pattern 4 contacts each droplet D disposed to C31, C13, and C33 later. This results in a possibility of opening a hole in the finally resulting conductive layer being lowered.

3C. Give Lyophilicity

Next, lyophilicity is given to the surface of the substrate 10A (not shown). In the first embodiment, the droplet D is disposed on the dot pattern 4 fixed. Namely, the droplet D is disposed to each C11 again. This causes C31 to have lyophilicity with respect to the droplet D disposed to C31 later. As a result, this reduces a possibility that the droplet D disposed to C31 is drawn to C11 even though the droplet D contacts the droplet D or the dot pattern 4 that are disposed to C11. This results in a possibility of opening a hole in the finally resulting conductive layer being lowered. Here, the mechanism is not yet fully examined that the surface (C31) of the substrate 10A exhibits lyophilicity by disposing the droplet D to C11 again. The inventor et al. speculate, at the present moment, that a solvent atmosphere brought by the droplet D disposed again contributes to give lyophilicity to the substrate 10A or C31.

Here, the volume of the droplet D disposed to C11 again may be smaller than that of the droplet D already disposed to C11. Specifically, the droplet D may be disposed again to C11 with a volume that gives lyophilicity to C31 and keeps the dot pattern 4 on C11 isolated from the dot pattern 4 on its adjacent C11. The volume of the droplet D disposed to C11 again, of course, may be larger than that of the droplet D already disposed to C11.

If the substrate 10A exhibits some lyophilicity with respect to a functional liquid, the process to give lyophilicity may be omitted.

3D. Process to Dispose a First Joining Dot

After disposing the droplet D to all of C11s in the layer forming area, the landed diameter of the droplet D discharged from a droplet discharge device is set to be 32 μm. Namely, a driving waveform of the droplet discharge device is changed so as to discharge the droplet D having a volume larger than that of the droplet D already disposed to C11. A technique to change a driving waveform of a droplet discharge device, so-called a technique to realize a variable dot, is minutely disclosed in FIGS. 5 to 8 of JP-A-2001-58433. Thus, explanation of the details is omitted.

Figure 4:
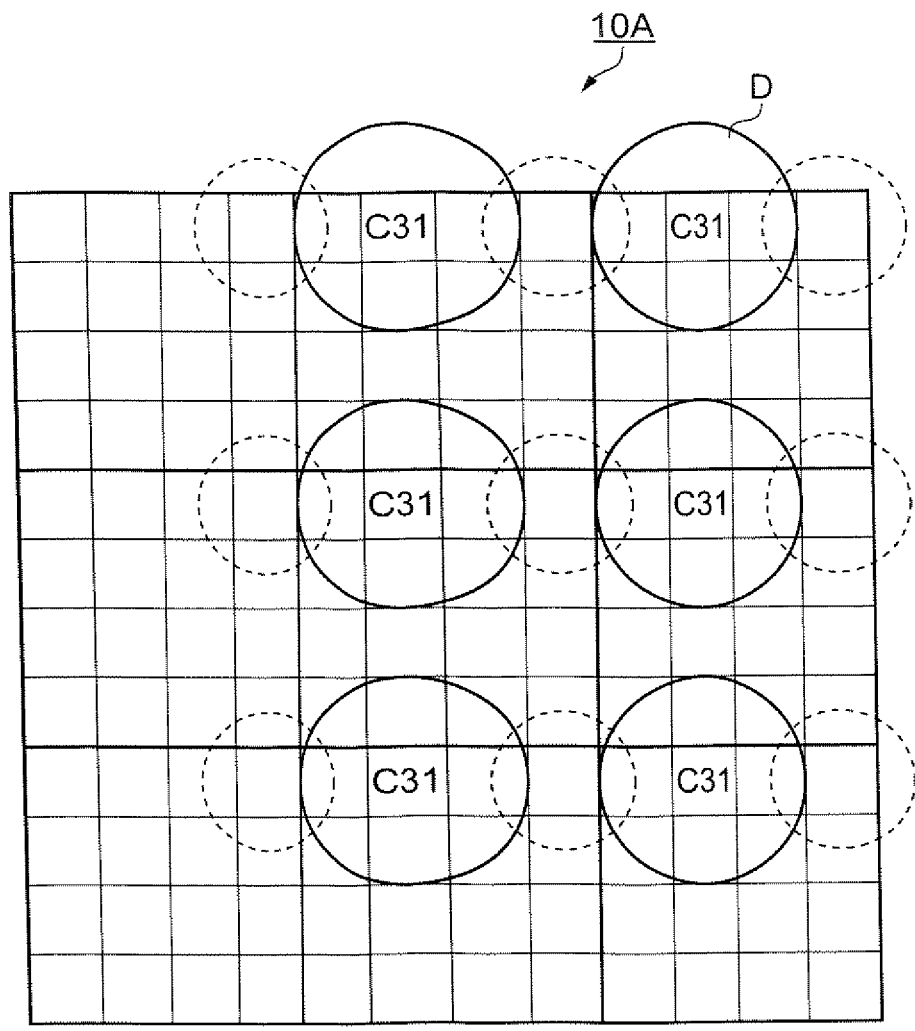
FIG. 4 is a diagram illustrating a process to dispose a droplet to C31s.

Then, as shown in FIG. 4, the droplet D is disposed to each of the plurality of C31s in the layer forming area. In this case, the droplet D is disposed so that the center of the droplet D coincides with the center of C31. Here, C31 is located at mid point of two C11s adjacent each other in the X-axis direction. Therefore, the distance between C31 and C11 that is the closest to the C31 is 22 μm. Here, the dot pattern 4 spreads on C11 in the range of 15 μm from the center of C11. In contrast, the droplet D spreads on C31 in the range of 16 μm from the center of C31. Thus, the droplet D disposed on C31 contacts the dot pattern 4 on C11. In this specification, the droplet disposed to C31, C13, and C33 is also described as a "joining dot."

Figure 5:
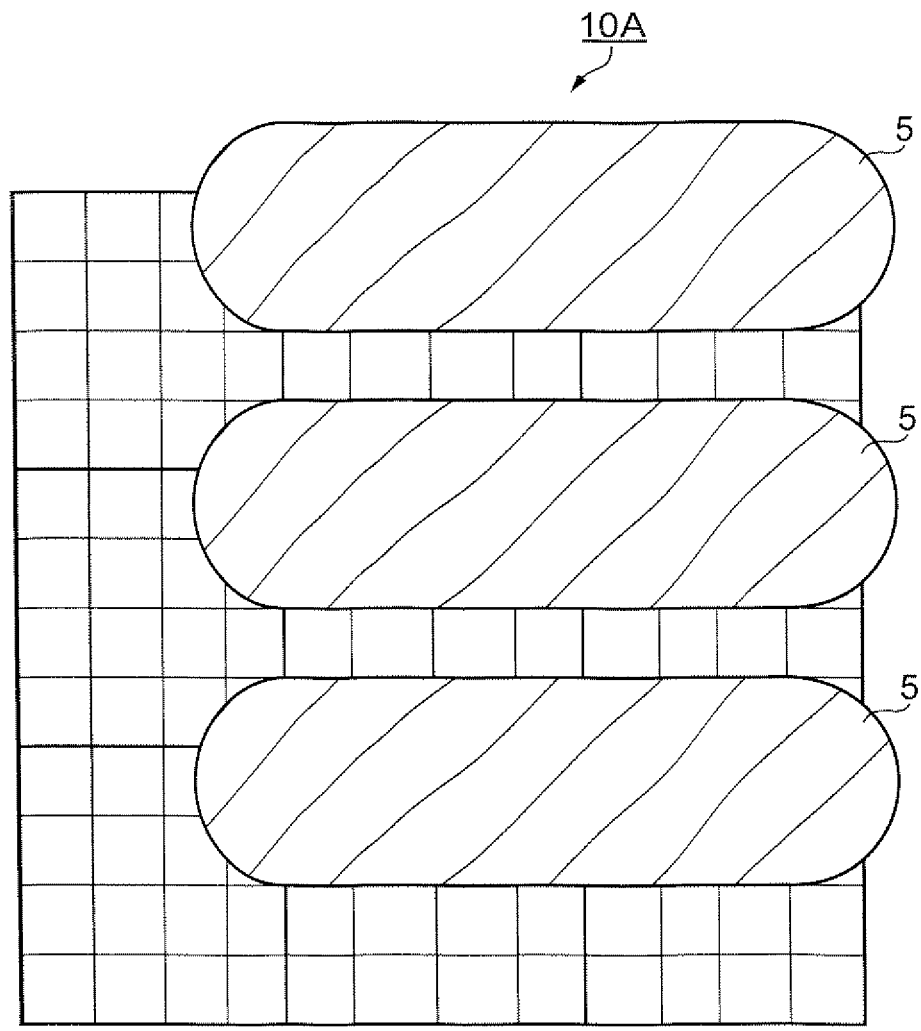
FIG. 5 is a schematic view illustrating line patterns achieved after disposing the droplet to C31s.

In this process, the droplet D is disposed to C31 located in the X-axis direction with respect to C11. Accordingly, the dot pattern 4 extends to the X-axis direction. In the process, a plurality of dot patterns 4 arranged in the X-axis direction is joined in the X-axis direction. Upon completion of disposing the droplet D to all of C31s in the layer forming area, a plurality of line patterns 5, each of which is structured by the droplet D disposed on C11 and the droplet D disposed on C31, is formed as shown in FIG. 5. Each of the plurality of line patterns 5 extends in the X-axis direction and is isolated from each other.

3E. Process to Dispose a Second Joining Dot

Figure 6:
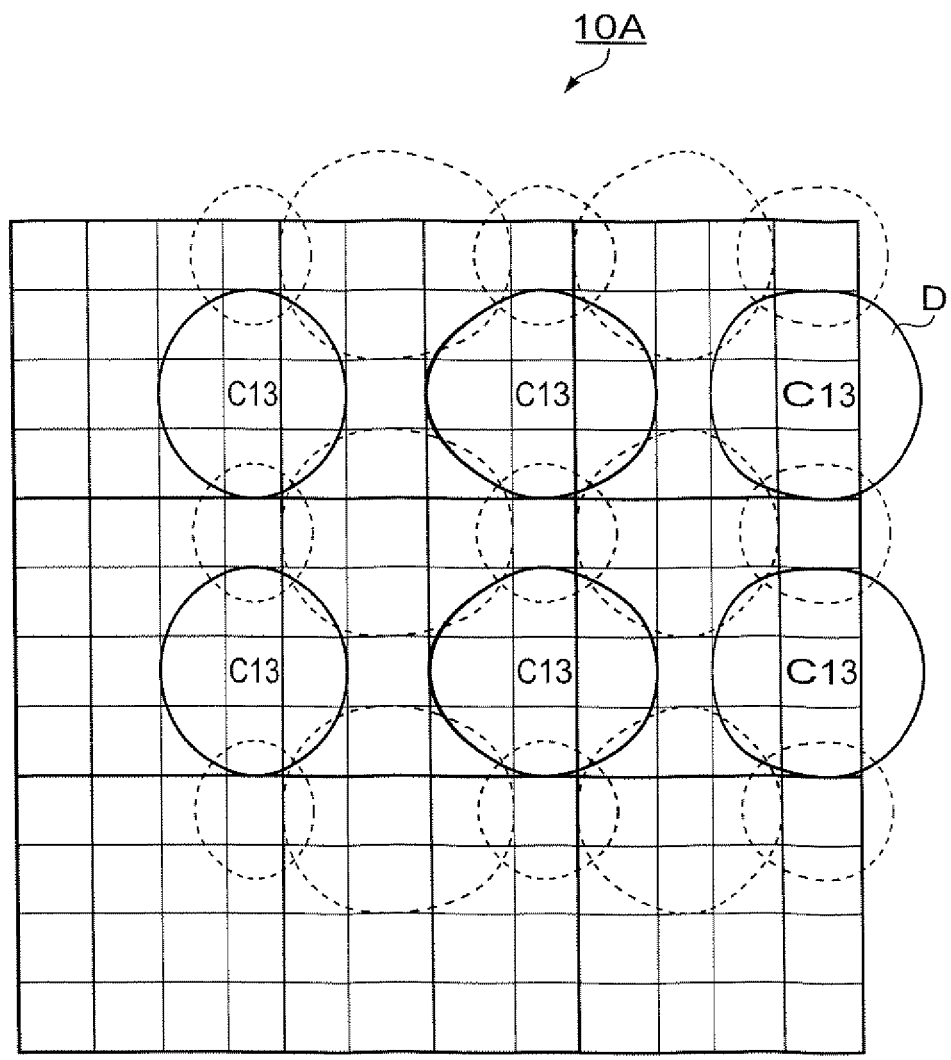
FIG. 6 is a diagram illustrating a process to dispose a droplet to C13s.

After disposing the droplet D to all of C31s in the layer forming area, the landed diameter of the droplet D discharged from a droplet discharge device is set to be 32 μm. Then, as shown in FIG. 6, the droplet D is disposed to each of the plurality of C13s in the layer forming area. In this case, the droplet D is disposed so that the center of the droplet D coincides with the center of C13. Here, C13 is located at mid point of two C11s adjacent each other in the Y-axis direction. Therefore, the distance between C13 and C11 that is the closest to the C13 is 30 μm. Here, the droplet D disposed on C11 spreads in the range of 15 μm from the center of C11. In contrast, the droplet D spreads on C13 in the range of 16 μm from the center of C13. Thus, the droplet D disposed on C13 contacts the line pattern 5.

Figure 7:
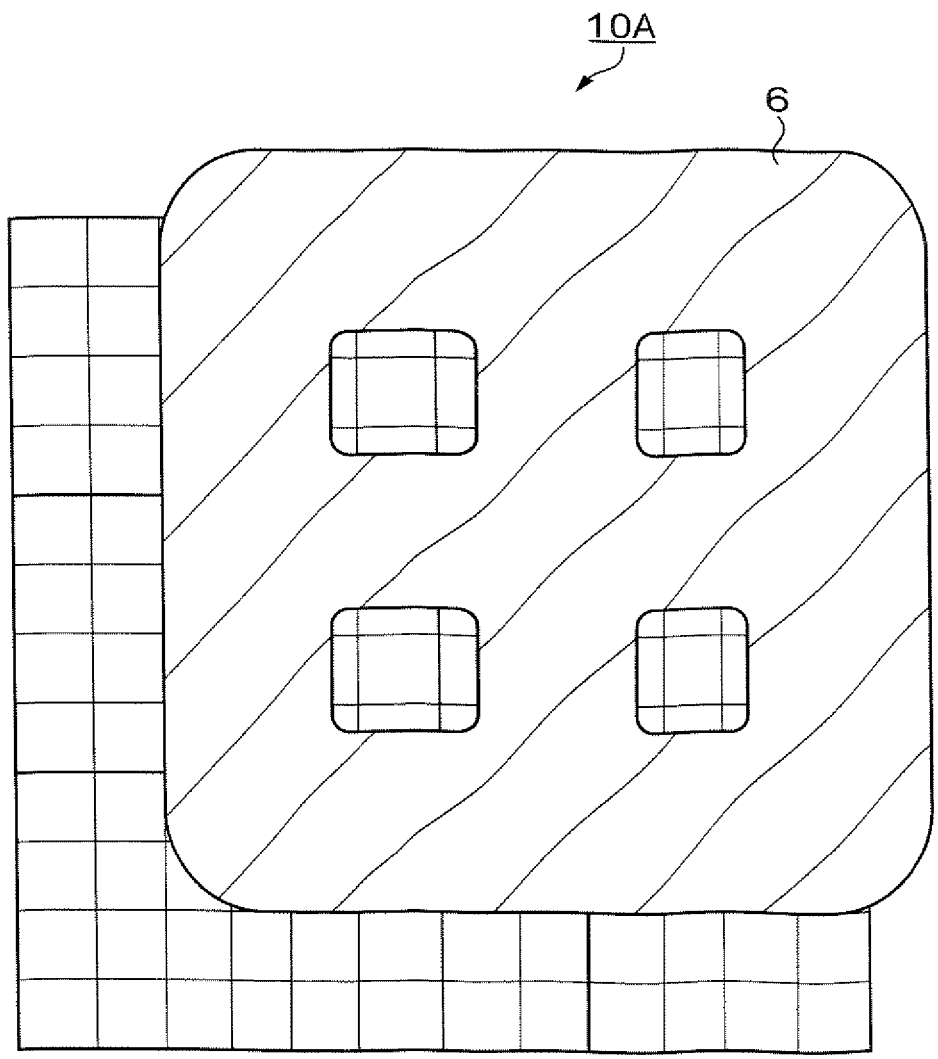
FIG. 7 is a schematic view illustrating a grid pattern achieved after disposing the droplet to C13s.

In this process, the droplet D is disposed to C13 located in the Y-axis direction with respect to C11. Accordingly, each line pattern 5 extends to the Y-axis direction. In the process, the plurality of line patterns 5 is joined in the Y-axis direction. Upon completion of disposing the droplet D to all of C13s in the layer forming area, a grid pattern 6, which is structured by the droplet D disposed on C11, the droplet D disposed on C31, and the droplet D disposed on C13, is formed as shown in FIG. 7.

3F. Process to Dispose a Third Joining Dot

Figure 8:
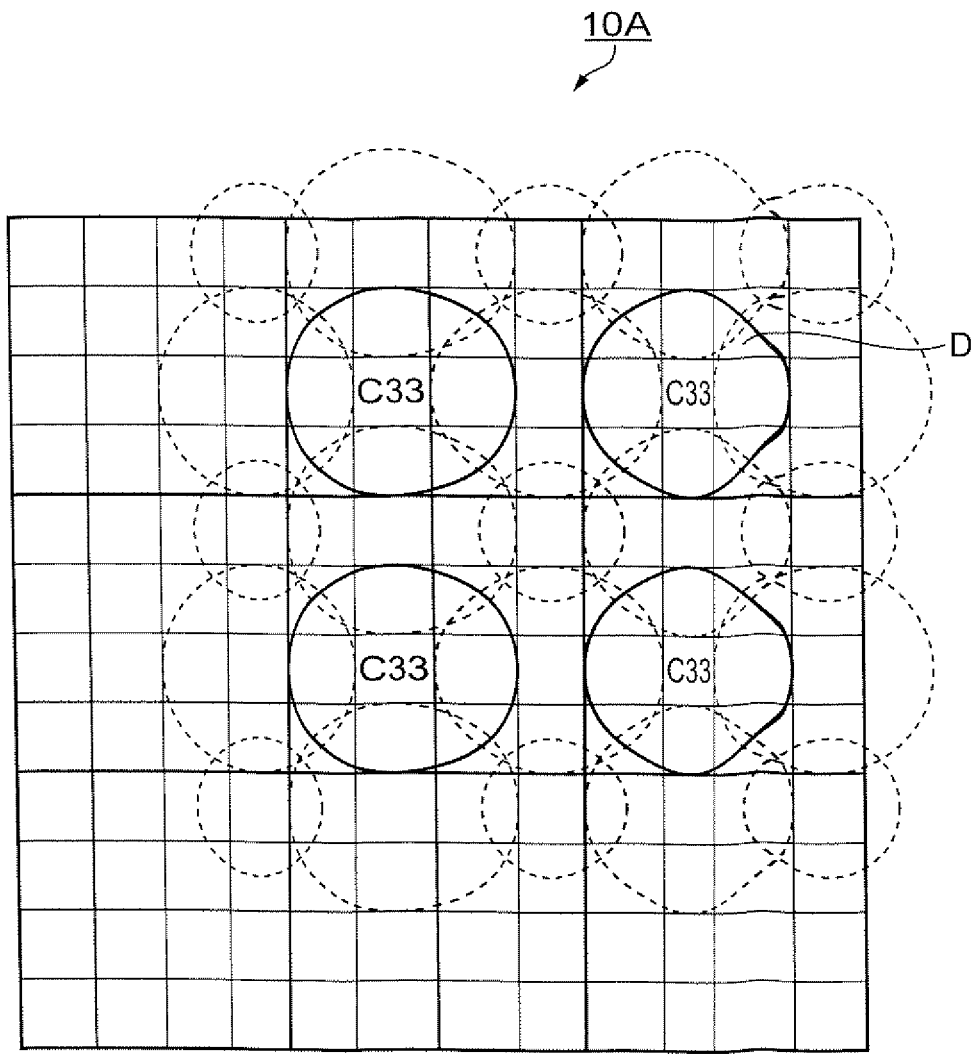
FIG. 8 is a diagram illustrating a process to dispose a droplet to C33s.

After disposing the droplet D to all of C13s in the layer forming area, the landed diameter of the droplet D discharged from a droplet discharge device is set to be 32 μm. Then, as shown in FIG. 8, the droplet D is disposed to each of the plurality of C33s in the layer forming area. In this case, the droplet D is disposed so that the center of the droplet D coincides with the center of C33. Here, C31 is located at the mid point of two C11s adjacent each other in the combined direction U. The droplet D disposed on C33 plugs up a hole in the grid pattern 6 structured by the droplet D already disposed. Accordingly, the grid pattern 6, which is structured by the droplet D already disposed, extends in the combined direction U by disposing the droplet D on C33.

Figure 9:
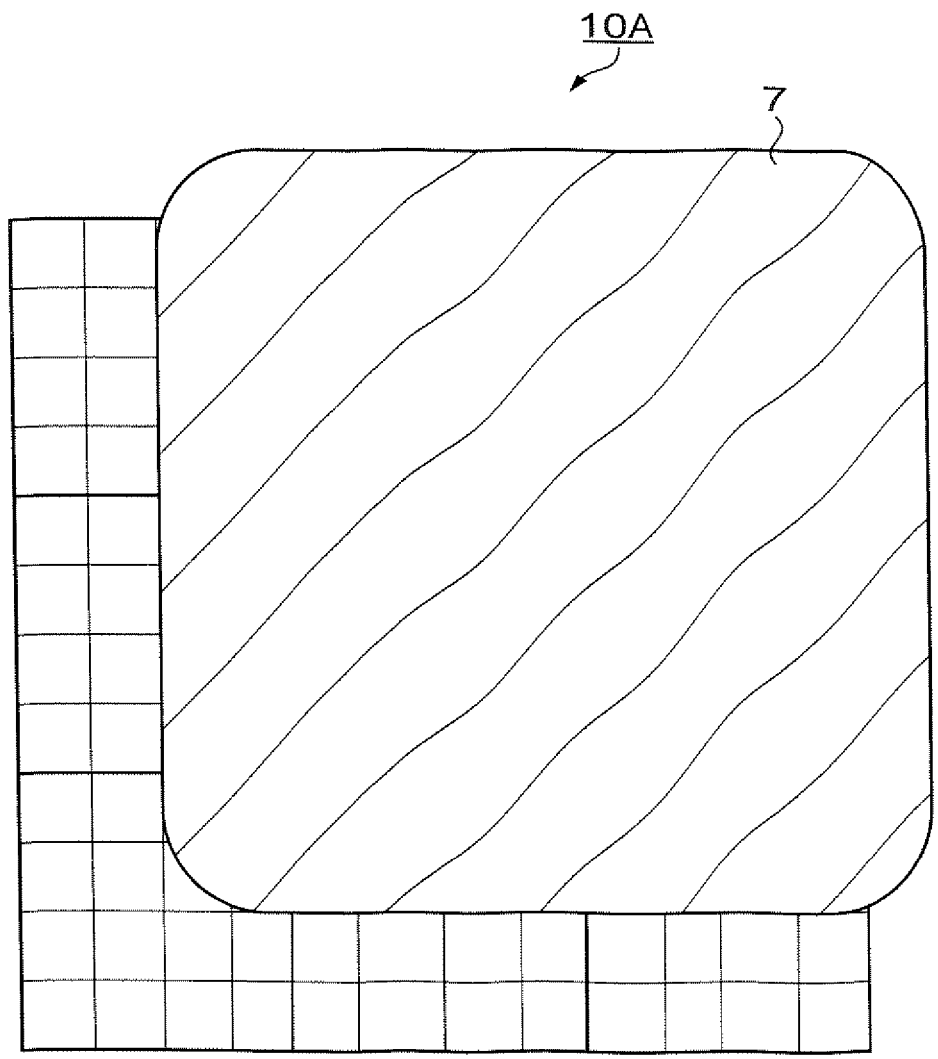
FIG. 9 is a schematic view illustrating a solid pattern achieved after disposing the droplet to C33s.

Upon completion of disposing the droplet D to all of C33s in the layer forming area, as shown in FIG. 9, a solid pattern 7, which is structured by the droplets D disposed on C11s, C31s, C13s and C33s, is formed. In the first embodiment, the layer forming area, which corresponds to 9 blocks×9 blocks on the surface of the substrate 10A, is covered with the solid pattern 7 without spaces. Here, the area covered with the solid pattern 7 (area of the layer forming area) is slightly larger than that of 9 blocks×9 blocks, since the droplet D spreads on the surface as described above.

As describe above, each droplet D is disposed on C11s, C31s, C13s, and C33s in this order in the layer forming area. Accordingly, the solid pattern 7, which is continuously extended in the X-axis, Y-axis directions and the combined direction U from C11, can be formed by the droplets D disposed on four types of the block 1, even if the surface of the substrate 10A has lyophobicity. Namely, the solid pattern 7 without holes can be formed.

3G. Activation Process

Figure 10:
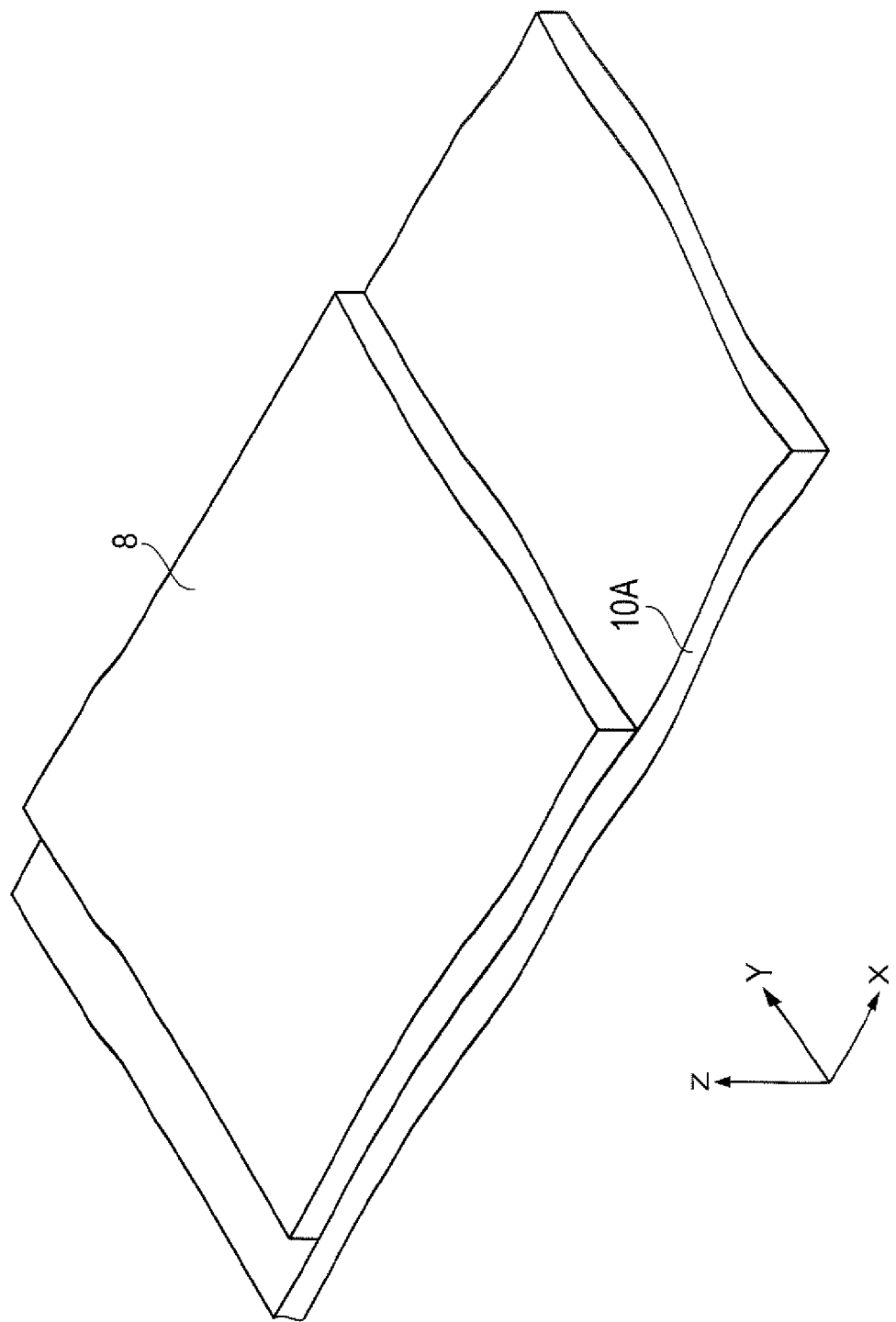
FIG. 10 is a schematic view illustrating a conductive layer achieved by activating the solid pattern in FIG. 9.

Next, the solid pattern 7 is activated. Specifically, in the first embodiment, the solid pattern 7 is heated so that silver particles in the solid pattern 7 are sintered or fusion bonded. The silver particles that are sintered or fusion bonded exhibit conductivity in the solid pattern 7, thereby a conductive layer 8 is achieved as shown in FIG. 10.

Figure 11:
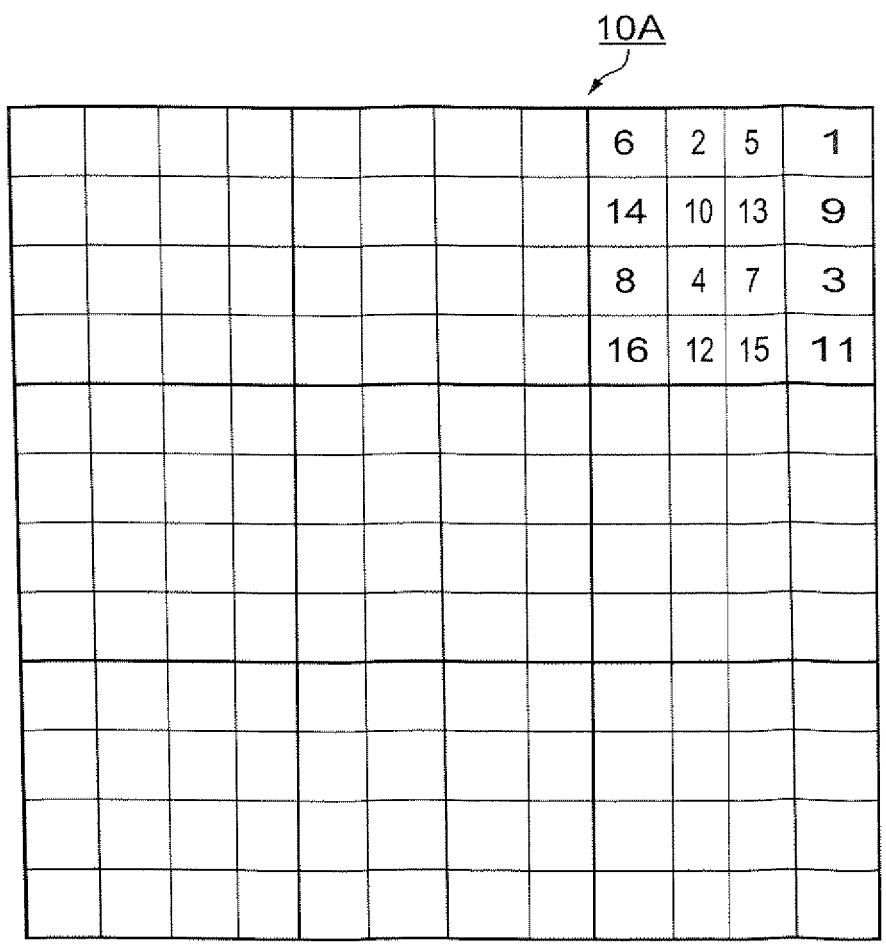
FIG. 11 is a diagram illustrating another order to dispose a droplet to the blocks.
Figure 11:
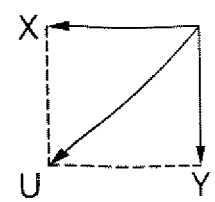

If the conductive layer 8 is achieved with insufficient thickness uniformity, 12 pieces of the droplets D may be additionally disposed in each block group 1G as shown in FIG. 11 prior to the activation. Specifically, the droplet D may be disposed to each of 12 blocks 1, i.e., C21, C41, C23, C43, C12, C32, C14, C34, C22, C42, C24, and C44 in this order in addition to four blocks 1, i.e., C11, C31, C13, and C33. Namely, the droplet D may be disposed to all of the blocks 1 in the block group 1G. Accordingly, the conductive layer 8 having a more uniformed thickness can be achieved. Here, the volume of each of 12 pieces of the droplets additionally disposed may be smaller than that of each of four droplets already disposed.

In the first embodiment, the conductive layer 8 having no holes is achieved by the following manner as described above: the plurality of dot patterns 4 is disposed on the substrate 10A; the plurality of line patterns 5 extending in the X-axis direction is formed; the plurality of line patterns 5 is joined in the Y-axis direction to form the grid pattern 6; the droplet D is disposed to a remaining space so as to form the solid pattern 7 two-dimensionally continuous; and the solid pattern 7 is activated to achieve the conductive layer 8 having no holes.

Here, the order among the block groups 1G is not specifically limited as long as the order of disposing the droplet D in the block group 1G is that described above. For example, when disposing the droplet D to the same type of block 1, e.g. C11, the plurality of block groups 1G included in one row extending in the X-axis direction may be processed almost simultaneously. Likewise, the plurality of block groups 1G included in one row extending in the Y-axis direction may be processed almost simultaneously. When disposing the droplet D to the blocks 1 of the same type, each block group 1 may be processed in order.

According to the method for forming a layer of the first embodiment, the line pattern 5 extending in the X-axis direction is formed prior to form the grid pattern 6 in the processes to form the conductive layer 8 as targeted, regardless the order among the block groups 1G. However, the present invention is not limited to the process order. Specifically, the droplet D may be disposed so that the line pattern 5 extending in the Y-axis direction is formed prior to form the grid pattern 6.

Figure 12:
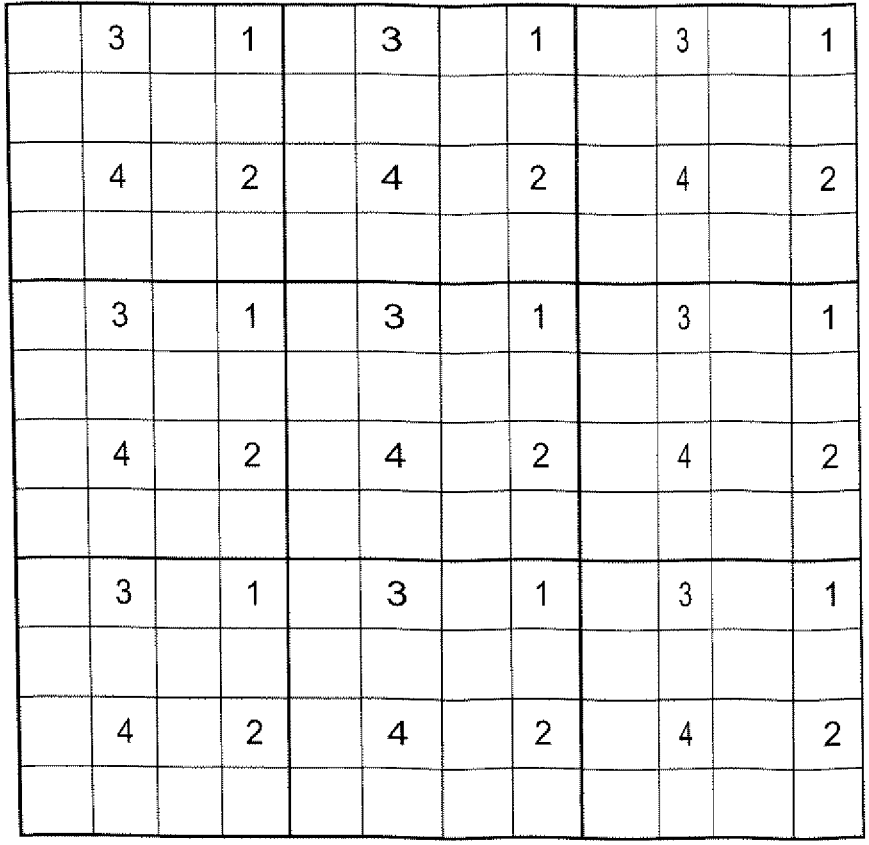
FIG. 12 is a diagram illustrating still another order to dispose a droplet to the blocks.
Figure 12:
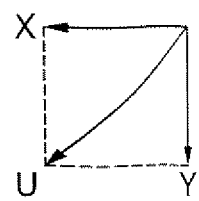
Figure 13:
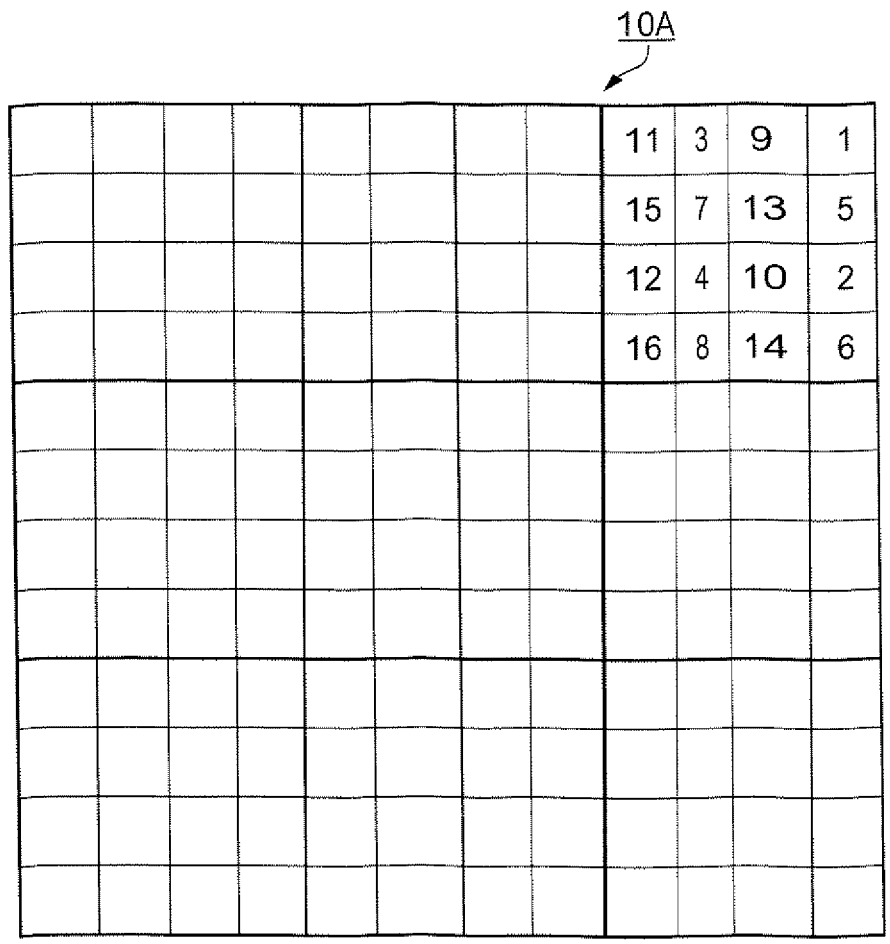
FIG. 13 is a diagram illustrating yet another order to dispose a droplet to the blocks.
Figure 13:
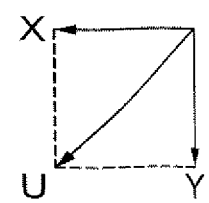

More specifically, each droplet D is disposed to each of four blocks 1, i.e., C11, C13, C31, and C33 in this order as shown in FIG. 12. In addition, the droplet D may be disposed to each of C12, C14, C32, C34, C21, C23, C41, C43, C22, C24, C42, and C44 in this order in addition to C11, C13, C31, and C33. Accordingly, a layer having a more uniformed thickness can be achieved.

4. A Method for Manufacturing an Active Matrix Substrate

The invention can apply to manufacture an active matrix substrate. First, an example of the active matrix substrate to which the invention is applied will be described with reference to the drawings. The active matrix substrate is provided with a thin film transistor (TFT) element serving as a switching element.

4A. An Example of the Active Matrix Substrate

Figure 14:
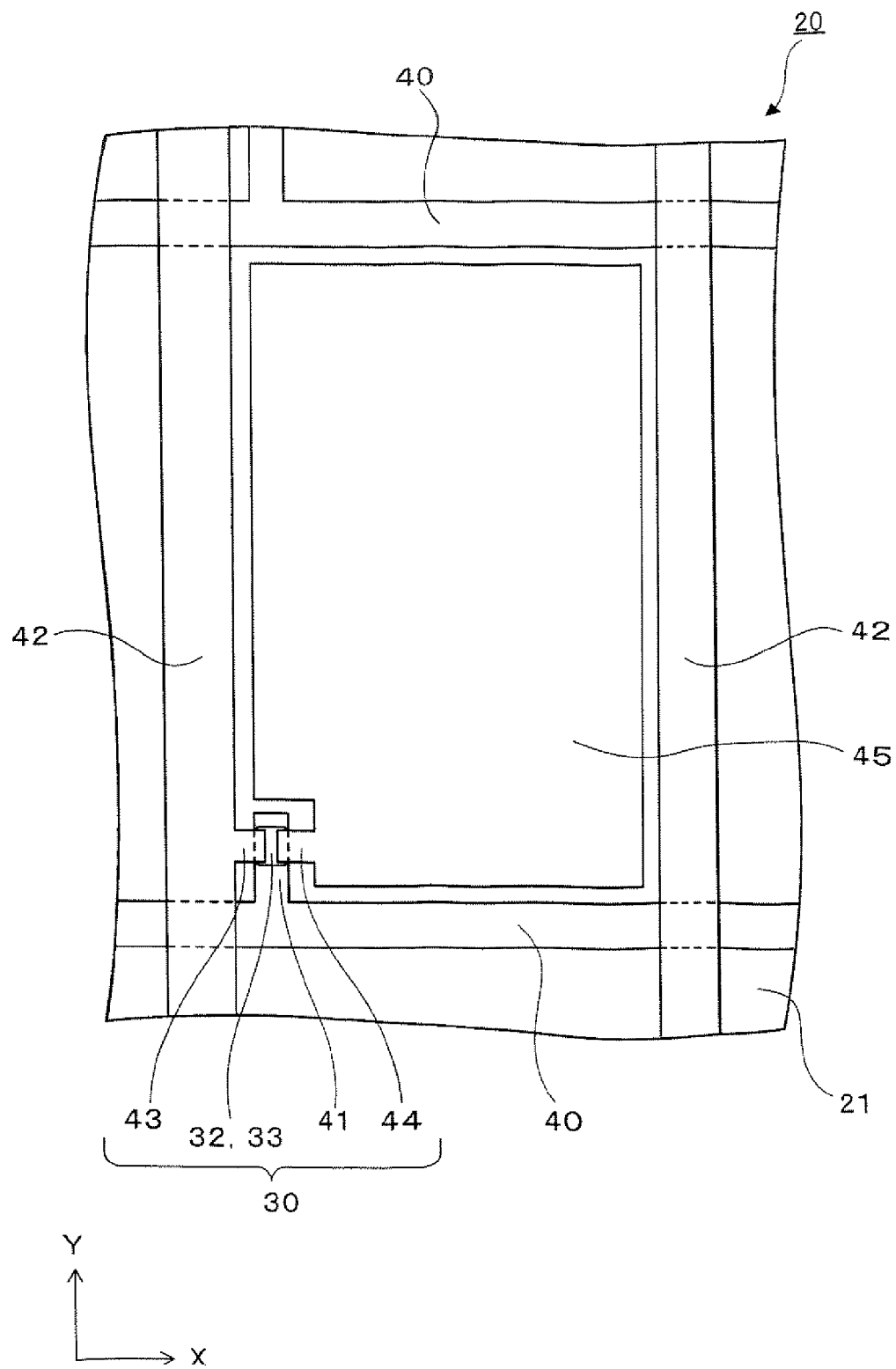
FIG. 14 is a schematic view enlarging a part of an active matrix substrate.
Figure 15:
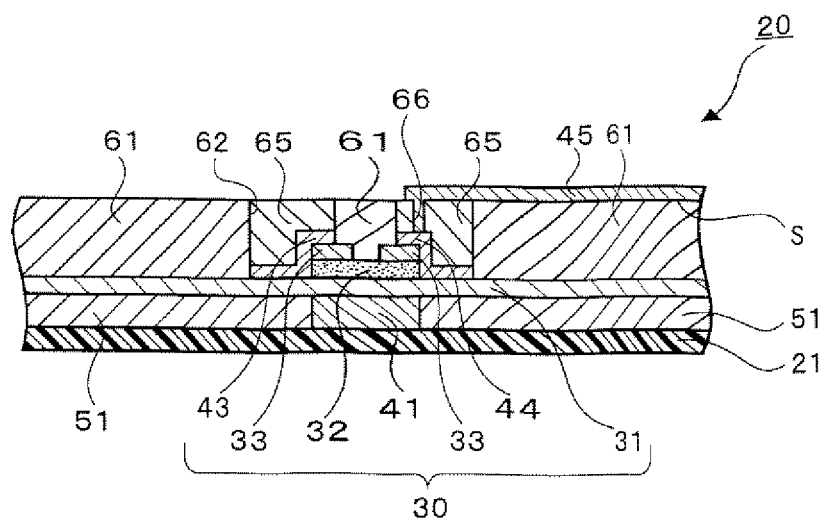
FIG. 15 is a schematic view illustrating the section of the active matrix substrate.

FIG. 14 is a schematic view enlarging a part of the active matrix substrate. FIG. 15 is a schematic view illustrating the section of the active matrix substrate.

As shown in FIG. 14, an active matrix substrate 20 is provided with a substrate 21, a gate insulation film 31 (refer to FIG. 15), an active layer 32, a contact layer 33, a gate wiring line 40, a gate electrode 41, a source wiring line 42, a source electrode 43 and a drain electrode 44. A TFT 30 includes the gate insulation film 31, the active layer 32, the contact layer 33, the gate electrode 41, the source electrode 43, and the drain electrode 44. In addition, a pixel electrode 45 is provided on the active matrix substrate 20.

A plurality of gate wiring lines 40 extends in the X-axis direction on the substrate 21. Each gate wiring line 40 is connected to each gate electrode 41 on the substrate 21. The gate insulation film 31 covers the plurality of gate wiring lines 40 and a plurality of gate electrodes 41. A plurality of source electrodes 42 extends in the Y-axis direction on the gate insulation film 31. The X-axis and the Y-axis directions are nearly orthogonal.

Located on the gate insulation film 31 is a semiconductor layer. A part, at which the gate electrode 41 and the semiconductor layer are overlapped, of the semiconductor layer is the active layer 32 of the TFT 30. The description will proceed paying attention to the TFT 30.

On the active layer 32, 2 contact layers 33 are spaced apart each other with a predetermined distance. On one of the contact layer 33, the source electrode 43 is located, on the other of the contact layer 33, the drain electrode 44 is located. Each source electrode 43 is electrically connected to respective source wiring lines 42. Each drain electrode 44 is electrically connected to respective pixel electrodes 45 through a contact hole 66 described later.

The gate wiring line 42, the gate electrode 43, the drain electrode 44, 2 contact layers 33, and the active layer 32 are covered with an interlayer insulation layer. One of the functions of the interlayer insulation layer is to provide a surface S having a nearly flat surface by absorbing unevenness, which is caused by the gate wiring line 42, the active layer 32, and the like, in an underlayer. The interlayer insulation layer includes a plurality of banks 61 and a plurality of insulation material layers 65, which will be described later.

Located on the drain electrode 44 is the contact hole 66 that reaches to the drain electrode 44 by passing through the interlayer insulation layer. On the surface S of the interlayer insulation layer, the pixel electrode 45 is located. The drain electrode 44 and the pixel electrode 45 are connected with a conductive member provided in the contact hole 66.

4B. An Example of a Method for Manufacturing an Active Matrix Substrate

Next, a method for manufacturing an active matrix substrate according to a second embodiment of the invention will be described with reference to the drawings. FIGS. 16A through 16D are schematic views illustrating the method for manufacturing an active matrix substrate of the second embodiment. First, the substrate 21 is prepared. As the material for the substrate 21, various types of materials such as glass, quartz glass, a Si wafer, a plastic film, and a metal plate can be used. The substrate 21 may also include those substrates on each surface of which a semiconductor film, a metal film, a dielectric film, an organic film or the like is formed.

Figure 16A:
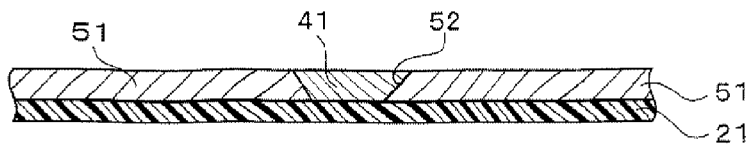
FIGS. 16A through 16D are schematic views to explain a method for manufacturing an active matrix substrate according to a second embodiment of the invention.

Then, as shown in FIG. 16A, the bank 51 is formed on the cleaned upper surface of the substrate 21 by using photolithography, for example. Provided to the bank 51 is an opening 52 having a size of from 1/20 to 1/10 of one pixel pitch. As the material for the bank 51, a polymer material such as acrylic, polyimide, olefin, and melamine is preferably used, since the bank 51 has optical transparency and lyophobicity after it is formed. The bank 51 is subjected to a process to improve surface lyophobicity after it is formed. Instead of this, a material into which a lyophobic component, e.g., fluorine group, is included may be used for forming the bank 51. In this case, a process to improve surface lyophobicity can be omitted.

Then, a droplet of a functional liquid is disposed by an inkjet process so that the opening 52, which is partitioned by the bank 51, is filled with the functional liquid, thereby the gate wiring line 40 (not shown) and the gate electrode 41 are formed. Here, examples of conductive fine particles contained in a functional liquid include: metal fine particles containing gold, silver, copper, tin, lead, or the like, and their oxides; and fine particles of a conductive polymer and a superconducting material. These conductive particles may be used by coating their surfaces with an organic matter to improve their dispersibility.

In the inkjet process, a fine pattern of the gate wiring line 40 can be formed without running off the opening 52, since enough lyophobicity is given to the bank 51 in advance. Then, a layer having a flat upper surface, which is structured by the bank 51, the gate wiring line 40, and the gate electrode 41, is formed on the substrate 21 after a preliminary drying and firing process. In order to achieve a favorable discharge in the opening 52, the opening 52 preferably has a shape, which is tapered outwardly toward a discharged position, as shown in FIG. 16A. This shape makes it possible to dispose the droplet of a discharged functional liquid into a sufficiently deep part.

Figure 16B:
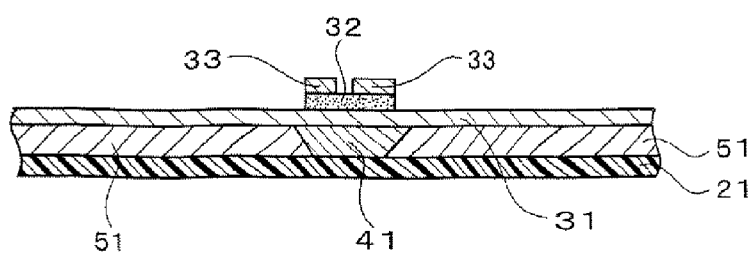

Next, as shown in FIG. 16B, the gate insulation film 31 is formed by applying the method for forming a layer of the invention. In this case, a solid insulation layer is formed instead of the solid conductive layer described in the first embodiment. In order to form a solid insulation layer, a functional liquid containing an insulation material instead of a conductive material is prepared. Such functional liquid preferably includes a photo curable insulation resin as an insulation material, and an organic solvent that dissolves the insulation resin. If a functional liquid contains such insulation material, both the fixing and activation processes described above correspond to the following process. A process in which a dot pattern or a solid pattern made of the functional liquid is irradiated by light, or a process to heat the dot pattern or the solid pattern so as to cure the insulation resin. Note that the surfaces of the bank 51, the gate wiring line 40, and the gate electrode 41 are the underlayer surface for the gate insulation film 31.

Next, the active layer 32 and the contact layer 33 are continuously deposited by a plasma CVD method. Specifically, an amorphous silicon film and an n+ silicon film are deposited as the active layer 32 and the contact layer 33 respectively by changing raw material gas or plasma generating conditions. When using the CVD method, a thermal history of from 300 to 350 degrees centigrade is required. Using an inorganic material for the bank can avoid the setback concerning transparency and heat resistance.

Figure 16C:
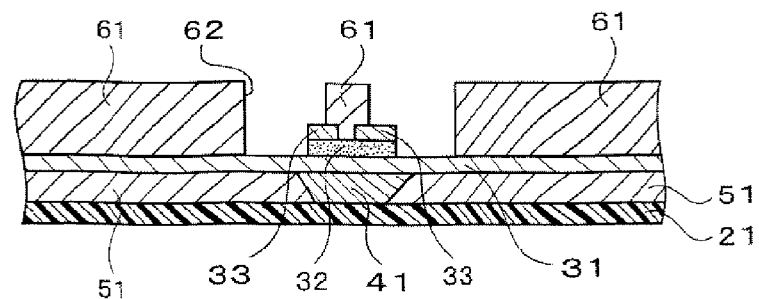

Then, as shown in FIG. 16C, the bank 61 is formed on the upper surface of the substrate 31 by using photolithography, for example. An opening 62, which intersects the opening 52, having a size of from 1/20 to 1/10 of one pixel pitch will be provided to the bank 61. As the material for the bank 61, a polymer material such as acrylic, polyimide, olefin, and melamine is preferably used, since the bank 61 has optical transparency and lyophobicity after it is formed. The bank 61 is subjected to a process to improve surface lyophobicity after it is formed. Instead of this, a material into which a lyophobic component, e.g. fluorine group, is included may be used for forming the bank 61. In this case, a process to improve surface lyopobicity can be omitted.

Figure 16D:
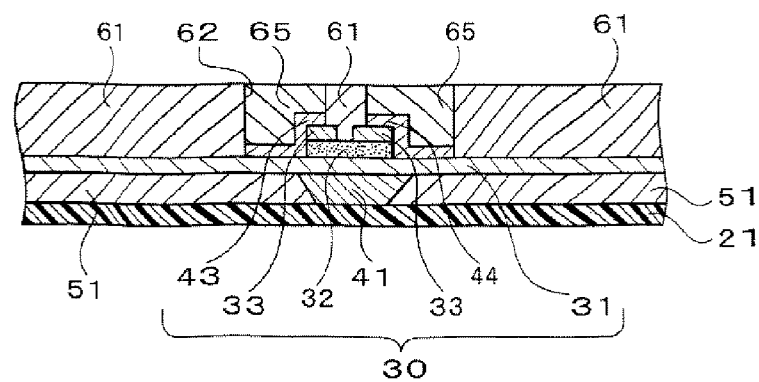

Next, a droplet of a functional liquid is disposed by an inkjet process so as to cover an area in which the gate insulation film 31, the active layer 32, and the contact layer 33 are exposed inside the opening 62 partitioned by the bank 61, thereby the source wiring line 42 (not shown) intersecting the gate wiring line 40, the source electrode 43, and the drain electrode 44 are formed as shown in FIG. 16D. Here, metal fine particles containing gold, silver, copper, aluminum, or the like, their oxides, and a conductive polymer are preferably used for a conductive material contained in a functional liquid. The source wiring line 42, the source electrode 43, and the drain electrode 44 can be formed as a fine wiring pattern without running out from the opening 62, since enough lyophobicity is preliminarily given to the bank 61.

Then, the insulation material layer 65 is disposed so that the opening 62, in which the source wiring line 42, the source electrode 43, and the drain electrode 44 have been disposed, is filled with it. Accordingly, a layer structured with the bank 61 and the insulation material layer 65 is formed on the substrate 21. Next, as shown in FIG. 15, the contact hole 66 is formed in the insulation material layer 65. Through the processes described above, the active matrix substrate 20 can be achieved.

In the second embodiment, the pixel electrode 45 is additionally formed on the upper surfaces of the bank 61, the insulation material layer 65, and the contact hole 66 by applying the method for forming a layer of the invention. As for the method for forming the pixel electrode 45, the method for forming a solid conductive layer described in the first embodiment can be applied. Since the pixel electrode 45 is a transparent electrode, ITO is used, for example, as conductive fine particles contained in its material. The pixel electrode 45 is electrically connected to the drain electrode 44 through the contact hole 66. Note that the surfaces of the bank 61, the insulation material layer 65, and the contact hole 66 are the underlayer surface for the pixel electrode 45.

In the second embodiment, the insulation film 31 is formed by the method for forming a solid insulation layer, while the pixel electrode 45 is formed by the method for forming a solid conductive layer. This reduces a possibility that a hole is formed in the resulting insulation layer and conductive layer. When a liquid crystal display device is structured using the active matrix substrate 20, an alignment layer (not shown) is formed to align liquid crystal molecules in a given direction on the upper surface of the pixel electrode 45. The method for forming a layer of the invention can also apply to form the alignment layer. In addition, a storage capacitor line may be provided to the active matrix substrate 20 when a liquid crystal display device is structured using the active matrix substrate 20.

5. Method for Manufacturing a Multilayered Wiring Substrate

The invention can also apply to manufacture a multilayered wiring substrate. First, an example of the multilayered wiring substrate to which the invention is applied will be described with reference to the drawings. In the multilayered wiring substrate, multilayered wiring lines are formed on one side of the substrate.

5A. An Example of a Multilayered Wiring Substrate

Figure 17:
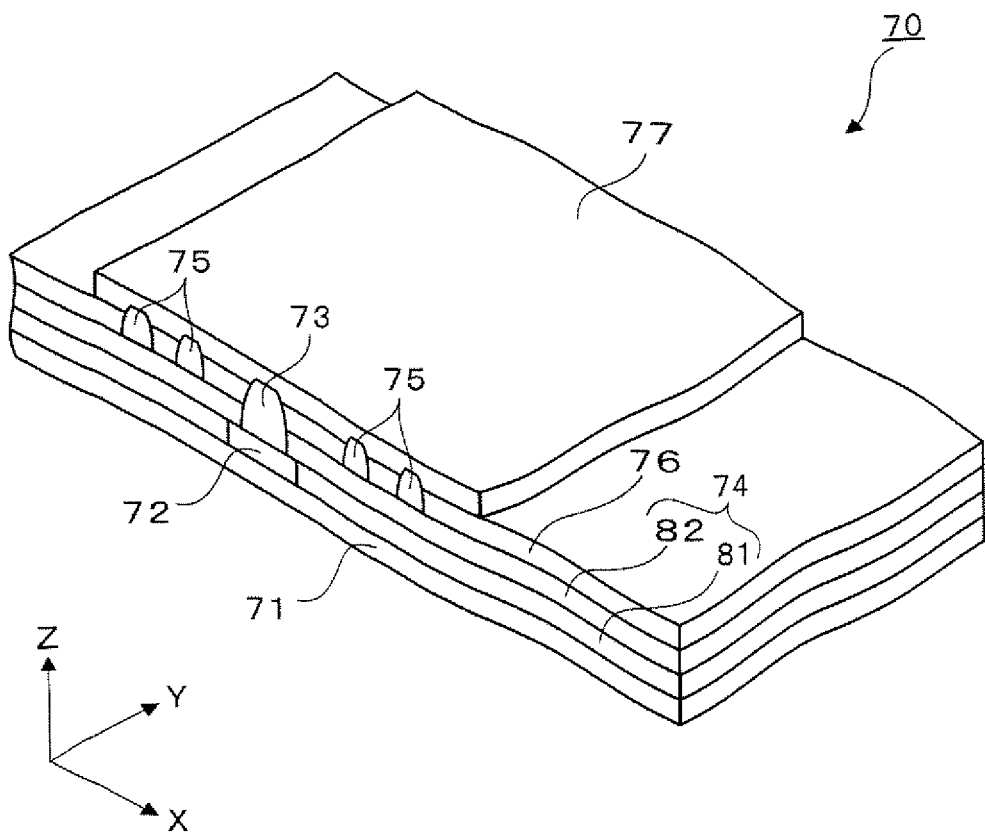
FIG. 17 is a schematic view illustrating a structure of the multilayered wiring substrate.

FIG. 17 is a schematic view illustrating a structure of the multilayered wiring substrate. As shown in FIG. 17, a multilayered wiring substrate 70 is provided with a substrate 71, a conductive pattern 72, a conductive post 73, an insulation layer 74 composed of sub insulation layers 81 and 82, a plurality of dummy posts 75, an insulation layer 76, and an insulation layer 77.

5B. An Example of a Method for Manufacturing a Multilayered Wiring Substrate.

Next, a method for manufacturing a multilayered wiring substrate according to a third embodiment of the invention will be described with reference to the drawings. FIGS. 18A through 18D and 19A through 19C are explanatory views illustrating the method for manufacturing a multilayered wiring substrate of the third embodiment.

Figure 18A:
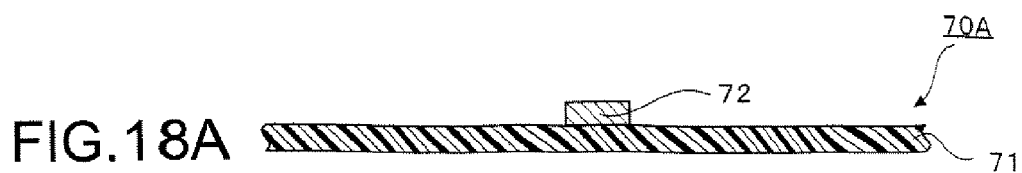
FIGS. 18A through 18D are schematic views to explain a method for manufacturing a multilayered wiring substrate according to a third embodiment of the invention.

First, a base 70A as shown in FIG. 18A is prepared. The base 70A is provided with the substrate 71 and the conductive pattern 72 positioned on the substrate 71. The substrate 71 is a flexible substrate made of polyimide. The substrate 71 has a tape-like shape. Thus, the substrate 71 is also called a tape substrate. In the third embodiment, "substrate 70A" is a collective term of the substrate 71, and one or more of pattern or layer disposed on the substrate 71.

Figure 18B:
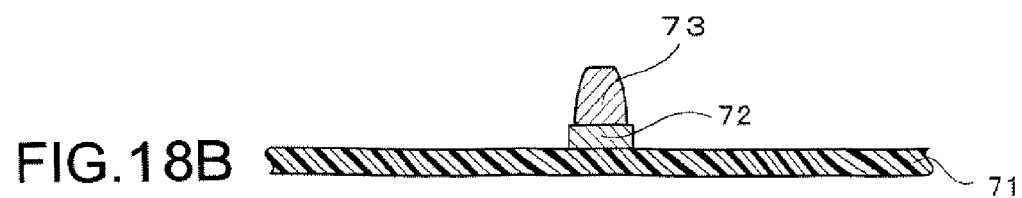

Then, as shown in FIG. 18B, the conductive post 73 is disposed on a part of the conductive pattern 72 by an inkjet process. The conductive post 73 is structured so as to contain a conductive material having a good adhesiveness to the conductive layer 77 described later. In the third embodiment, the conductive post 73 is structured so as to contain silver since the conductive layer 77 is made of silver. This structure allows the conductive post 73 and the conductive layer 77 to closely contact each other.

Figure 18C:
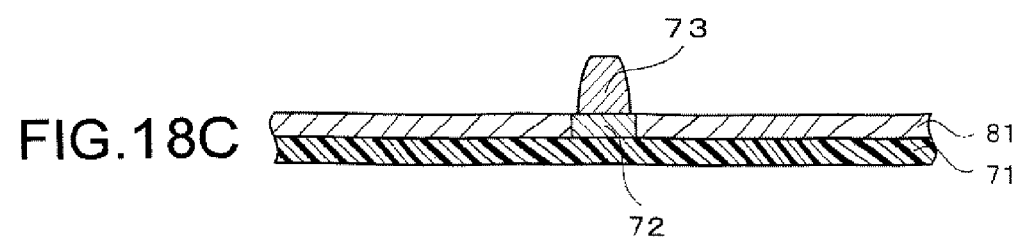
Figure 18D:
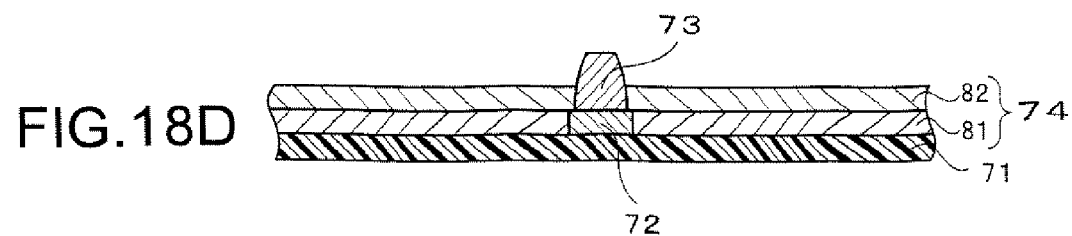

After forming the conductive post 73, the insulation layer 74 is formed as shown in FIGS. 18C and 18D. The insulation layer 74 surrounds the lower part of the side face of the conductive post 73 and covers the conductive pattern 72. Here, the insulation layer 74, which is composed of sub insulation layers 81 and 82 layered each other, will be formed as described below by applying the method for forming a layer of the invention.

First, the sub insulation layer 81 is formed on a part, on which the conductive pattern 72 is not formed, of the surface of the substrate 71 as shown in FIG. 18C. As for the method for forming the sub insulation layer 81, the method for forming a solid insulation layer can be applied. Here, the thickness of the sub insulation layer 81 is set so as to be nearly the same as that of the conductive pattern 72. Accordingly, the surfaces of the sub insulation layer 81 and the conductive pattern 72 are positioned at nearly the same level after forming the sub insulation layer 81. In addition, the sub insulation layer 81 contains an acrylic resin in the third embodiment. Note that the surface of the substrate 71 is the underlayer for the sub insulation layer 81.

Next, the sub insulation layer 82 is formed on the surfaces of the conductive pattern 72 and the sub insulation layer 81 as shown in FIG. 18D. As for the method for forming the sub insulation layer 82, the method for forming a solid insulation layer can be applied. The sub insulation layer 82 is formed so as to cover the conductive pattern 72 and the sub insulation layer 81 serving as the underlayer, and surround the lower part of the side face of the conductive post 73. In addition, the sub insulation layer 82 contains an acrylic resin. Note that the surfaces of the conductive pattern 72 and the sub insulation layer 81 are the underlayer for the sub insulation layer 82.

Figure 19A:
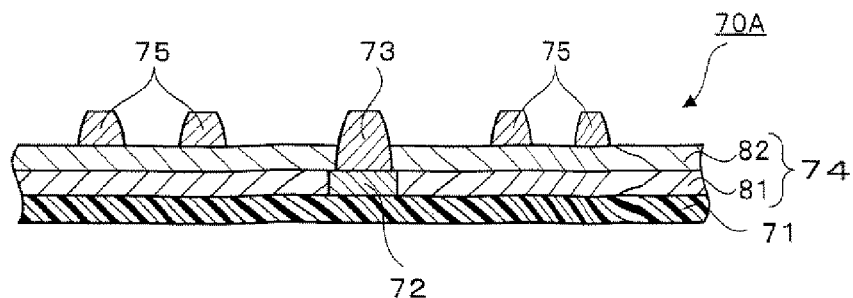
FIGS. 19A through 19C are schematic views to explain the method for manufacturing a multilayered wiring substrate according to the third embodiment of the invention.

Next, as shown in FIG. 19A, the plurality of dummy posts 75 is formed on the insulation layer 74 by an inkjet process. The plurality of dummy posts 75 is formed so that the upper parts of each dummy post 75 and conductive post 73 are positioned at nearly the same level. Each dummy post 75 is structured so as to contain a conductive material having a good adhesiveness to the conductive layer 77 described later. In the third embodiment, each dummy post 75 is structured so as to contain silver since the conductive layer 77 is made of silver. This structure allows each dummy post 75 and the conductive layer 77 to closely contact each other.

Figure 19B:
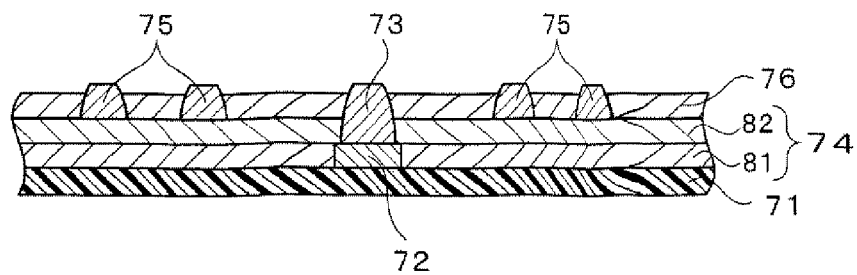

Next, as shown in FIG. 19B, the insulation layer 76 is formed on the insulation layer 74 so as to surround the side faces of each dummy post 75 and the conductive post 73 protruded from the insulation layer 74. The thickness of the insulation layer 76 is set so that the upper parts of each dummy post 75 and the conductive post 73 are exposed from the insulation layer 76. As for the method for forming the insulation layer 76, the method for forming a solid insulation layer can be applied. Note that the surface of the insulation layer 74, i.e., the surface of the sub insulation layer 82, is the underlayer for the insulation layer 76.

The insulation layer 76 provided as described above prevents the plurality of dummy posts 75 from being pulled out from the insulation layer 76 even though an external force is applied to the dummy posts 75 along the Z-axis direction in order to pull out the dummy posts 75 from the insulation layer 76. Namely, each dummy post 75 is fixed to the insulation layer 76.

The insulation layer 76 is structured so as to contain an insulation material having a good adhesiveness to the insulation layer 74. The insulation layer 76 is structured so as to contain an acrylic resin since the insulation layer 74 is structured so as to contain the acrylic resin in the third embodiment. This structure allows the insulation layers 76 and 74 are closely contacted each other. Namely, the insulation layer 76 is fixed to the insulation layer 74.

Figure 19C:
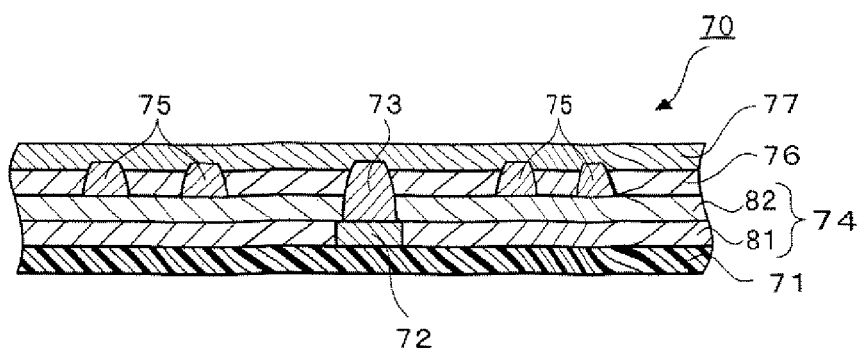

Next, as shown in FIG. 19C, the conductive layer 77 is formed on the insulation layer 76 so as to connect the upper parts of each dummy post 75 and the conductive post 73 by applying the method for forming a layer of the invention. As for the method for forming the conductive layer 77, the method for forming a solid conductive layer can be applied. Note that the surfaces of the insulation layer 76 and each dummy post 75 are the underlayer for the conductive layer 77.

In the third embodiment, the multilayered wiring substrate 70 can be achieved from the base 70A by the above-described processes. Here, the conductive layer 77 contains silver. Since each dummy post 75 contains silver as described above, the conductive layer 77 and each dummy post 75 are closely connected each other. Namely, the conductive layer 77 is fixed to each dummy post 75.

Since each dummy post 75 is fixed to the insulation layer 76 as described above, the conductive layer 77 is also fixed to the insulation layer 76. In addition, the insulation layer 76 is fixed to the insulation layer 74. Consequently, the conductive layer 77 is also fixed to the insulation layer 74 located further lower from the conductive layer 77.

In the third embodiment, the insulation layer 74 composed of the sub insulation layers 81 and 82 is formed by the method for forming a solid insulation layer, while the conductive layer 77 is formed by the method for forming a solid conductive layer. This reduces a possibility that a hole is formed in the resulting insulation layer and conductive layer.

In the third embodiment, the multilayered wiring substrate 70 is composed of five layers layered in the Z-axis direction from the substrate 71 serving as the lowermost layer to the conductive layer 77 serving as the uppermost layer. Practically, more layers may be present between the substrate 71 and the insulation layer 74. In addition, electronic components such as resistors, capacitors, LSI bare chips, and LSI packages may be embedded between insulation layers or insulation patterns in the multilayered wiring substrate 70. Further, instead of the substrate 71 made of polyimide, using ceramics, glass, epoxy, glass epoxy, and silicon substrates can achieve the same effects described in the third embodiment.

Modification Example 1

In the above-described embodiment, lyophilicity is given to the surface of C31 by disposing the droplet D again to C11 after drying the dot pattern 4 on C11. However, the present invention is not limited to the process order. Specifically, lyophilicity may be given to C31 by exposing the surface of the substrate 10A to oxygen plasma or by an irradiation of ultraviolet rays to the surface of the substrate 10A.

Modification Example 2

In the above-described embodiment, a functional liquid to form a solid conductive layer contains silver nanoparticles. However, nanoparticles of other metals may be used instead of the silver nanoparticles. Examples of such metals may include gold, platinum, copper, palladium, rhodium, osmium, ruthenium, iridium, iron, tin, zinc, cobalt, nickel, chromium, titan, tantalum, tungsten, and indium. Any one of or an alloy of two or more of these materials may be used. Note that using a functional liquid containing silver nanoparticles is preferable for utilizing a droplet discharge device, since silver is easy to handle due to its comparatively low reduction temperature.

The functional liquid also may contain organic metal compounds instead of metal nanoparticles. The organic metal compound described here is such a compound that its metal is extracted when decomposed by heating. Examples of such organic metal compounds include chlorotriethylphosphine gold (I), chlorotrimethylphosphine gold (I), chlorotriphenylphosphine gold (I), silver (I), 2,4-pentanedionato complexes, trimethylphosphine (hexafluoroacetylacetonato) silver (I) complexes, and copper (I) hexafluoropentane dionato cyclooctadiene complexes.

As described above, the metal contained in a functional liquid may be in the form of either particles such as nanoparticles or compounds such as organic metal compounds.

The functional liquid may also include a soluble material of a conductive polymer such as polyaniline, polythiophene, polyphenylene vinylene, and poly (3,4 ethylenedioxythiophene) (PEDOT) instead of metal.

Modification Example 3

In the above-described embodiment, a droplet is disposed on the substrate 10A made of polyimide. Instead of the substrate 10A, using ceramics, glass, epoxy, glass epoxy, and silicon substrates can achieve the same effects described in the above-described embodiment. In addition, the underlayer surface to which a droplet is disposed is not limited to the surface of a substrate. The nearly flat surface of insulation layer or conductive layer may be favorable.

Modification Example 4

The size of the block 1, the number of blocks 1 included in the block group 1G, and the landed diameter of the droplet D are not limited those values in the above-described embodiment. Specifically, at least one of the size of the block 1, the number of blocks 1 included in the block group 1G, and the landed diameter of the droplet D may be set so that the dot pattern 4 on any C11 is isolated from the dot pattern 4 on its adjacent C11.

Modification Example 5

In the above-described embodiment, the landed diameter of each droplet D disposed to C31, C13, and C33 is the same. However, each landed diameter may be differentiated so as to achieve the conductive layer 8 having a further uniformed thickness, instead of such structure. In order to differentiate the landed diameter of the droplet D, the volume of the droplet D discharged is changed.

Modification Example 6

A surface modification treatment may be carried out to the surface of the substrate 10A to increase the degree of lyophobicity of an underlayer surface prior to disposing the droplet D to C11, C31, C13, and C33. This treatment makes the edge shape of the solid pattern 7 more sharp. Forming a fuluoroalkylsilane (FAS) film on the surface of the substrate 10A is known as a treatment to improve surface lyophobicity. Lyophobicity of a surface can also be improved by exposing the surface to a processing gas by employing an atmospheric pressure plasma method using a processing gas containing fluorine.

Modification Example 7

In the above-described embodiment, the conductive layer 8 is achieved as targeted by activating the solid pattern 7. However, the solid pattern 7 may be dried instead of activating the solid pattern 7 according to its material.

What is claimed is:
1. A method for forming a layer, comprising:
(a) dividing an underlayer surface into a grid having a plurality of sub-grids of equal size;
(b) after step (a), disposing a first droplets to a corner of each sub-grid from an array defined by an x direction and a second y-direction on the underlayer surface;
(c) after step (b), fixing the plurality of first droplets to the underlayer surface;
(d) after step (c), disposing second droplets directly between adjacent first droplets in the x-direction so that the second droplets overlap adjacent first droplets in the x-direction and so that gaps devoid of droplets remain between adjacent first droplets in the y-direction and between adjacent second droplets in the y-direction;
(e) after step (d), disposing third droplets directly between adjacent first droplets in the y-direction so that the third droplets overlap adjacent first droplets in the y-direction and so that gaps devoid of droplets remain between adjacent second droplets in the y-direction and between adjacent third droplets in the x-direction; and
(f) after step (e), disposing fourth droplets directly between adjacent second droplets in the y-direction and between adjacent third droplets in the x-direction so that no gaps remain between the first, second, and third droplets, wherein lyophilicity is provided to the underlayer surface between steps (c) and (d).

2. The method of claim 1, wherein the droplets include a conductive material.

3. The method of claim 1, wherein the each of the droplets overlap to an extent such that a film composed of the droplets has a uniform thickness.

4. The method of claim 1, wherein lyophilicity is provided by applying UV rays to the underlayer, or by exposing the underlayer to plasma.

* * * * *